(12) United States Patent
Park

(10) Patent No.: US 9,666,642 B2
(45) Date of Patent: May 30, 2017

(54) VARIABLE RESISTANCE MEMORY DEVICE AND METHOD OF DRIVING THE SAME

(71) Applicant: SK hynix Inc., Gyeonggi-do (KR)

(72) Inventor: Nam Kyun Park, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 121 days.

(21) Appl. No.: 13/950,681

(22) Filed: Jul. 25, 2013

(65) Prior Publication Data

US 2014/0268996 A1 Sep. 18, 2014

(30) Foreign Application Priority Data

Mar. 15, 2013 (KR) .................. 10-2013-0027872

(51) Int. Cl.
*G11C 13/00* (2006.01)
*H01L 27/24* (2006.01)
*H01L 45/00* (2006.01)
*H01L 27/22* (2006.01)

(52) U.S. Cl.
CPC .......... *H01L 27/249* (2013.01); *H01L 27/228* (2013.01); *H01L 27/2436* (2013.01); *H01L 45/04* (2013.01); *H01L 45/06* (2013.01); *H01L 45/1226* (2013.01); *H01L 45/14* (2013.01); *H01L 45/141* (2013.01); *H01L 45/147* (2013.01); *H01L 45/1666* (2013.01); *G11C 13/003* (2013.01); *G11C 2213/71* (2013.01); *G11C 2213/75* (2013.01)

(58) Field of Classification Search
CPC .................................................. G11C 13/0002
USPC ........................................................ 365/148
See application file for complete search history.

(56) References Cited

U.S. PATENT DOCUMENTS

| 5,604,158 A * | 2/1997 | Cadien ................ H01L 21/7684 257/E21.583 |
| 8,169,819 B2 * | 5/2012 | Shima ................. H01L 45/1683 257/278 |
| 8,829,646 B2 * | 9/2014 | Lung ..................... H01L 27/101 257/5 |
| 9,331,088 B2 * | 5/2016 | Takaki ............. H01L 27/11524 |
| 2008/0149913 A1 * | 6/2008 | Tanaka ................ H01L 27/2454 257/5 |
| 2008/0175032 A1 * | 7/2008 | Tanaka ................... G11C 5/025 365/51 |
| 2009/0114981 A1 * | 5/2009 | Sung ................... H01L 29/7827 257/329 |

(Continued)

FOREIGN PATENT DOCUMENTS

KR 1020130112219 10/2013

*Primary Examiner* — Anthan Tran
*Assistant Examiner* — Mushfique Siddique
(74) *Attorney, Agent, or Firm* — IP & T Group LLP

(57) ABSTRACT

A variable resistance memory device and a driving method thereof are provided. The variable resistance memory device includes a base layer and a pillar-shaped gate electrode formed on the base layer and extending substantially perpendicular to a surface of the base layer. A current transfer layer is formed to surround the pillar-shaped gate electrode. A variable resistance layer formed in an outer portion of the current transfer layer. A blocking layer blocks a path of current flowing through the current transfer layer based on a voltage applied voltage to the pillar-shaped gate electrode, and diverts the current flowing through the current transfer layer to the variable resistance layer.

6 Claims, 8 Drawing Sheets

(56) References Cited

U.S. PATENT DOCUMENTS

| | | | |
|---|---|---|---|
| 2009/0141547 A1* | 6/2009 | Jin | G11C 5/02 |
| | | | 365/163 |
| 2009/0146190 A1* | 6/2009 | Fukuzumi | H01L 27/11578 |
| | | | 257/204 |
| 2009/0310425 A1* | 12/2009 | Sim | H01L 27/11526 |
| | | | 365/185.29 |
| 2009/0321878 A1* | 12/2009 | Koo | H01L 27/101 |
| | | | 257/536 |
| 2010/0182828 A1 | 7/2010 | Shima et al. | |
| 2010/0270593 A1 | 10/2010 | Lung et al. | |
| 2010/0327323 A1 | 12/2010 | Choi | |
| 2011/0122676 A1* | 5/2011 | Murooka | G11C 5/063 |
| | | | 365/148 |
| 2011/0186851 A1* | 8/2011 | Son | H01L 21/20 |
| | | | 257/60 |
| 2011/0294290 A1* | 12/2011 | Nakanishi | H01L 27/11551 |
| | | | 438/666 |
| 2011/0299328 A1* | 12/2011 | Liu | G11C 5/025 |
| | | | 365/163 |
| 2012/0070944 A1* | 3/2012 | Kim | H01L 27/0688 |
| | | | 438/128 |
| 2012/0319072 A1* | 12/2012 | Wei | H01L 45/08 |
| | | | 257/4 |
| 2013/0105876 A1* | 5/2013 | Hwang | H01L 27/249 |
| | | | 257/314 |
| 2013/0201750 A1* | 8/2013 | Lee | G11C 13/0064 |
| | | | 365/148 |
| 2013/0208528 A1* | 8/2013 | Kwak | G11C 13/0004 |
| | | | 365/148 |
| 2014/0321193 A1* | 10/2014 | Park | H01L 45/16 |
| | | | 365/148 |
| 2015/0102282 A1* | 4/2015 | Zhang | H01L 27/249 |
| | | | 257/5 |

\* cited by examiner

VARIABLE RESISTANCE MEMORY DEVICE AND METHOD OF DRIVING THE SAME

CROSS-REFERENCES TO RELATED APPLICATION

The present application claims priority under 35 U.S.C. 119(a) to Korean application number 10-2013-0027872, filed on Mar. 15, 2013, in the Korean Intellectual Property Office, which is incorporated herein by reference in its entirety.

BACKGROUND

1. Technical Field

The inventive concept relates to a semiconductor integrated circuit device, and more particularly, to a variable resistance memory device using a junction transistor as a switching device and a method of driving the same.

2. Related Art

Memory devices are generally provided as internal semiconductor integrated circuits of computers or other electronic apparatuses. The memory devices are divided into volatile memory devices and nonvolatile memory devices.

Examples of variable resistance memory devices include, phase-change random access memory devices (PCRAMs), resistive RAMs (ReRAMs), or magnetic RAMs (MRAMs). PCRAMs have characteristics such as high memory density like dynamic random access memories (DRAMs), high reliability, and low power consumption.

Nonvolatile memory devices, including variable resistance memory devices, may be used in, for example, portable music players, such as MP3 players, movie players, portable phones, digital cameras, solid states drives (SSDs), portable memory sticks, or personal computers.

The variable resistance memory devices may include a plurality of memory cells arranged in a matrix form. Each memory cell, of the plurality of memory cells, may include a switching device connected to a word line and a resistance device connected to a bit line.

The switching device may be accessed when a corresponding word line is activated. A selected memory cell may be programmed based on a current transferred to the resistance device.

To realize a high integration density and multi-level cell, of the variable resistance memory device, the switching device is formed in a three-dimensional (3D) structure and the resistance device is formed in a stacked structure.

SUMMARY

An exemplary variable resistance memory device may include a base layer; a pillar-shaped gate electrode formed on the base layer and extending substantially perpendicular to a surface of the base layer; a current transfer layer formed to surround the pillar-shaped gate electrode; a variable resistance layer formed in an outer portion of the current transfer layer; and a blocking layer configured to block a path of current flowing through the current transfer layer based on a voltage applied voltage to the pillar-shaped gate electrode, and divert the current flowing through the current transfer layer to the variable resistance layer.

An exemplary variable resistance memory device may include a base layer; a pillar-shaped gate electrode formed on the base layer and extending substantially perpendicular to a surface of the base layer; a plurality of bit lines alternately stacked with a plurality of insulating layers around the pillar-shaped gate electrode; a plurality of variable resistance layers formed in outer portions of the plurality of bit lines; and a plurality of blocking layers configured to block paths of currents flowing through the plurality of bit lines based on a voltage applied voltage to the pillar-shaped gate electrode, and divert the currents flowing through the plurality of bit lines to the plurality of variable resistance layers.

A method of driving an exemplary variable resistance semiconductor device may include forming a pillar-shaped gate electrode on a base substrate; forming a bit line to surround the pillar-shaped gate electrode; forming a variable resistance layer in an outer portion of the bit line; and changing a path of a current flowing through the bit line to flow through the variable resistance layer based on a voltage applied to the pillar-shaped gate electrode.

These and other features, aspects, and implementations are described below in the section entitled "DETAILED DESCRIPTION".

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Figure 1:
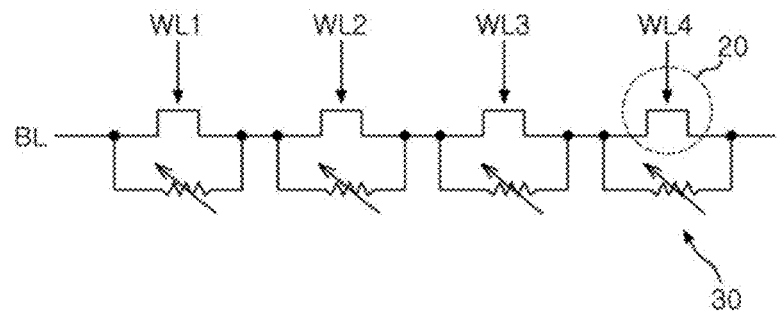
FIG. 1 is a circuit diagram illustrating an exemplary variable resistance memory device according.

Hereinafter, exemplary implementations will be described in greater detail with reference to the accompanying drawings.

Exemplary implementations are described herein with reference to cross-sectional illustrations that are schematic illustrations of exemplary implementations (and intermediate structures). As such, variations from the shapes of the illustrations as a result, for example, of manufacturing techniques and/or tolerances, are to be expected. Thus, exemplary implementations should not be construed as limited to the particular shapes of regions illustrated herein but may be to include deviations in shapes that result, for example, from manufacturing. Throughout the disclosure, reference numerals correspond directly to the like numbered parts in the various figures and exemplary implementations. Like reference numerals in the drawings denote like elements. It should be readily understood that the meaning of "on" and "over" in the present disclosure should be interpreted in the broadest manner such that "on" means not only "directly on" but also "on" something with an intermediate feature(s) or a layer(s) therebetween, and that "over" means not only directly on top but also on top of something with an intermediate feature(s) or a layer(s) therebetween.

Referring to FIG. 1, a variable resistance memory device 10 includes a plurality of word lines WL1 to WL4, a bit line BL, a junction transistor 20, and a variable resistor 30. The plurality of word lines WL1 to WL4 and the bit line BL are arranged to cross each other. The junction transistor 20 is a switching device and a junction transistor 20 is connected to each of interconnections of the plurality of word lines WL1 to WL4 and the bit line BL. The variable resistor 30 may be connected to be in parallel to the junction transistor 20. That is, the variable resistor 30 may be connected between a source and drain of the junction transistor 20. As is well-known, the junction transistor 20 performs a switching operation by expanding a depletion layer generated from a PN junction formed near a channel region, through which carriers pass, through an application of a reverse bias voltage from the gate electrode to the PN junction.

Figure 2:
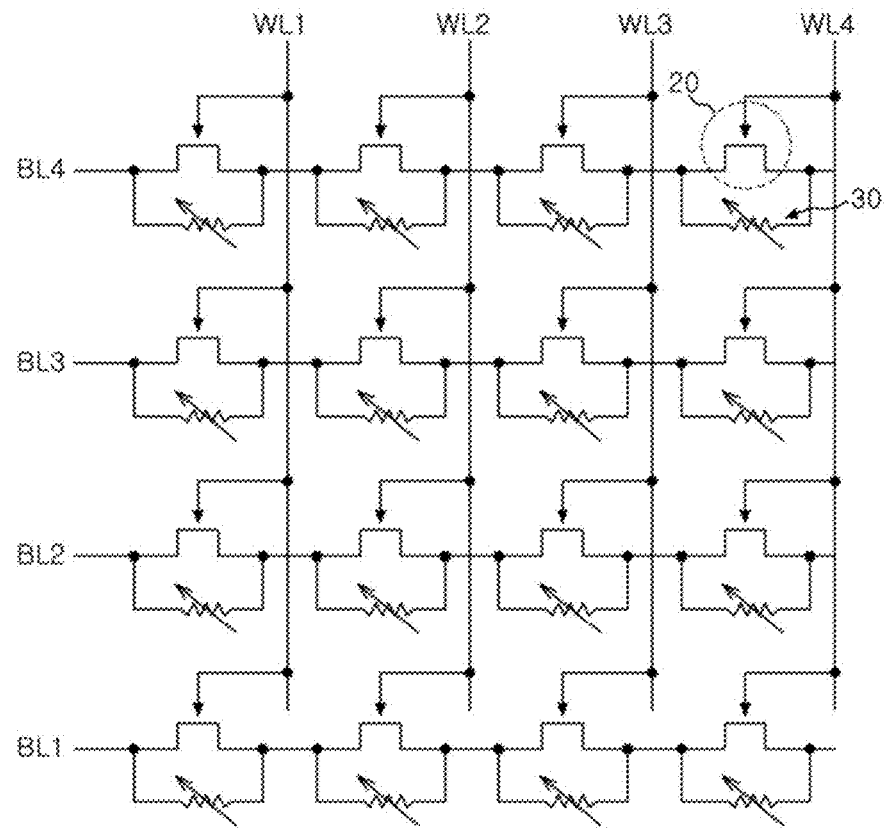
FIG. 2 is a circuit diagram illustrating an exemplary 3D variable resistance memory device.

A plurality of bit lines BL may be provided in a space partitioned as a unit cell area and the plurality of bit lines may be arranged in a stacked manner as illustrated in FIG. 2.

Figure 3A:
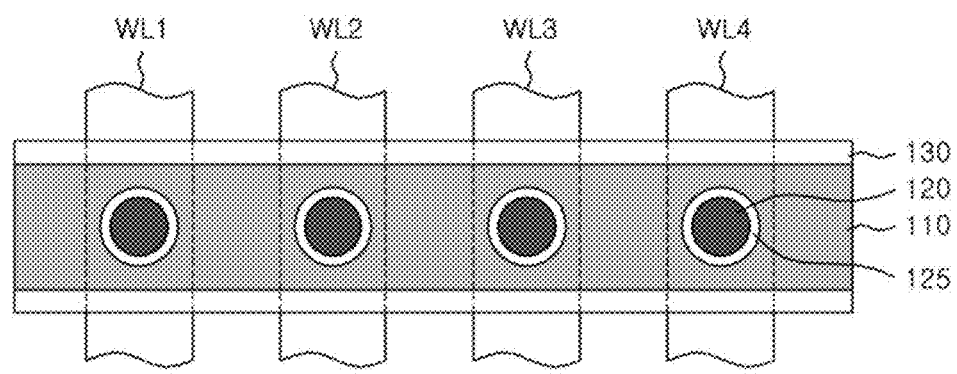
FIGS. 3A and 3B are plan views illustrating an exemplary variable resistance memory device.
Figure 3B:
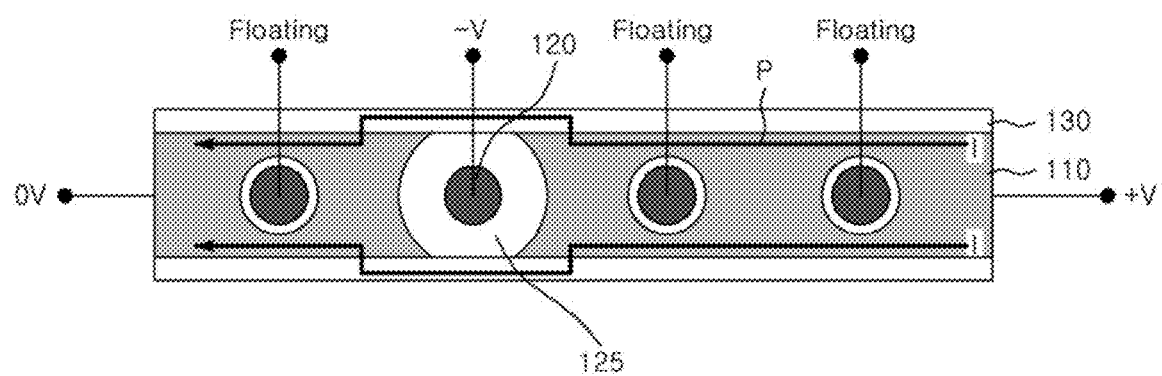
Figure 4A:
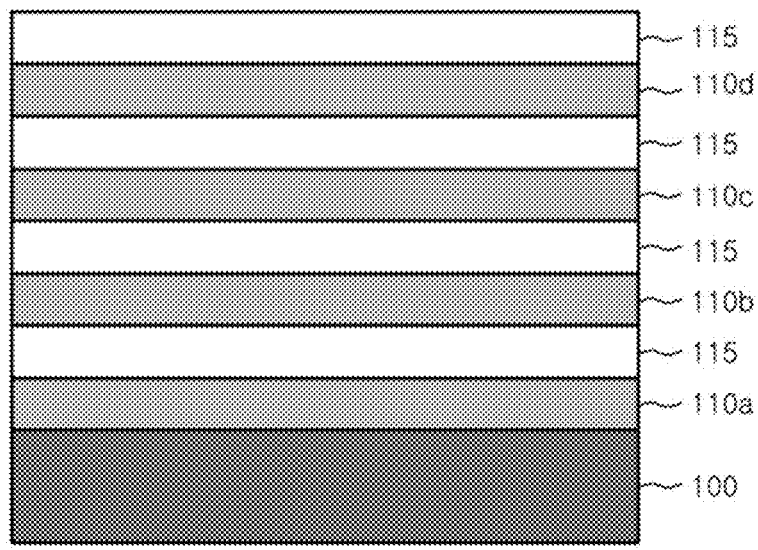
FIGS. 4A to 7B are cross-sectional views illustrating a method of fabricating an exemplary variable resistance memory device.
Figure 4B:
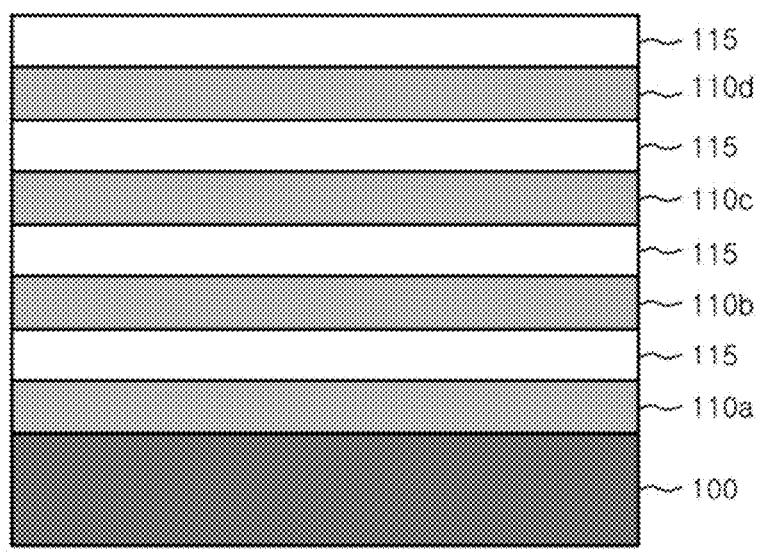

In an exemplary variable resistance memory device including a junction transistor, as illustrated in FIGS. 3A and 3B, a bit line 110 is formed to surround a gate electrode 120. A variable resistance layer 130 may be formed at an edge of the bit line 110.

The gate electrode 120 may have a pillar structure extending in a direction substantially perpendicular to a surface of a base layer (not shown). The gate electrode 120 may include first conductivity-type semiconductor layer, for example, a P-doped semiconductor layer. The bit line 110 may be formed on a side of the gate electrode 120 and may include, a second conductivity-type semiconductor layer, for example, an N-doped semiconductor layer, to form a PN junction with the gate electrode 120. In the exemplary implementation, the gate electrode 120 may be formed of a P-type polysilicon layer and the bit line 110 may be formed of an N-type polysilicon layer.

A depletion layer 125 may be formed in an interface between the gate electrode 120 and the bit line 110. A dimension (area) of the depletion layer 125 may be changed according to an applied voltage of the gate electrode 120. As well known, the depletion layer 125 may interfere with current flow and the area of the depletion layer may be expanded when a reverse bias voltage is applied to the gate electrode 120. Here, word lines WL1, WL2, WL3, and WL4 may be connected to the gate electrode 120 and may be substantially perpendicular to the bit line. Further, for clarity, illustration of the word lines WL1, WL3, and WL4 is omitted in FIG. 3B.

That is, as illustrated in FIG. 3B, a reverse bias voltage (−V) is applied to a selected gate electrode 120 and other gate electrodes 120 are floating. A predetermined current, for example, a write current I, is applied through the bit line 110.

The area of the depletion layer 125 around the selected gate electrode 120 is expanded based on the application of the reverse bias voltage to the selected gate electrode 120. Therefore, the write current I, flowing through the bit line 110, is blocked by the depletion layer 120 and is bypassed to the variable resistance layer 130 formed to be in contact with the bit line 110. That is, path P of the write current I changes.

Since the write current I is applied to the variable resistance layer 130 corresponding to the selected gate electrode 120, a resistance of the variable resistance layer 130 is changed by the write current I. Thus, data of "0" or "1" is written in the variable resistance layer 130.

A fabrication method of an exemplary variable resistance memory device will be described in detail with reference to FIGS. 4A to 7B. Here, FIGS. 4A, 5A, 6A, and 7A are cross-sectional views taken along a direction parallel to a word line of the exemplary variable resistance memory device and FIGS. 4B, 5B, 68, and 7B are cross-sectional views taken along a direction parallel to a bit line of the exemplary variable resistance memory device First, a plurality of bit line layers 110a, 110b, 110c, and 110d are sequentially stacked on a base layer 100 with insulating layers 115 interposed between the plurality of bit line layers 110. In other words, the plurality of bit line layers 110a, 110b, 110c, and 110d and the insulating layers 115 are alternately stacked on the base layer 100. Here, the base layer 100 may be an insulating layer formed on a semiconductor substrate (not shown).

Figure 5A:
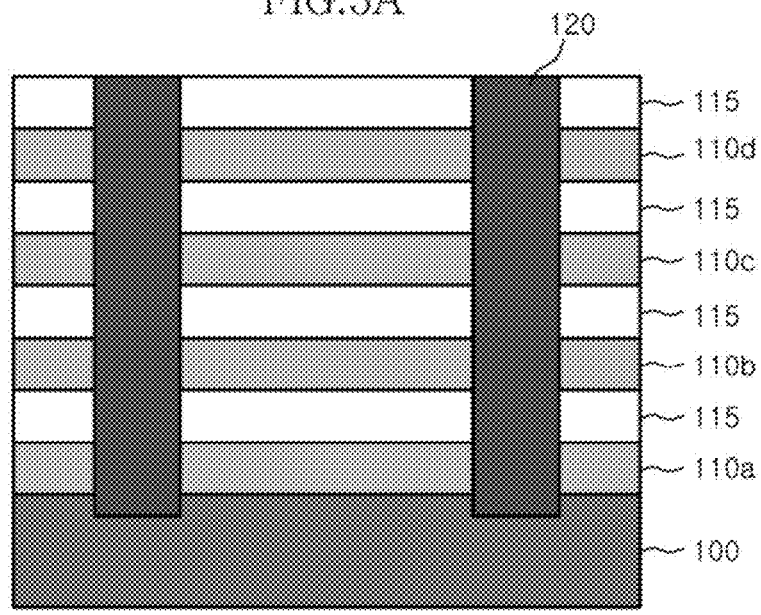

Referring to FIGS. 5A and 58, predetermined portions of the plurality of bit line layers 110a, 110b, 110c and 110d and the insulating layers 115 are patterned to form a through hole for a gate electrode (not shown). Subsequently, for example, a P-type polysilicon layer may be formed in the through hole to form a gate electrode 120. The P-type polysilicon layer may be formed by a known deposition process and a known planarization process.

Figure 6A:
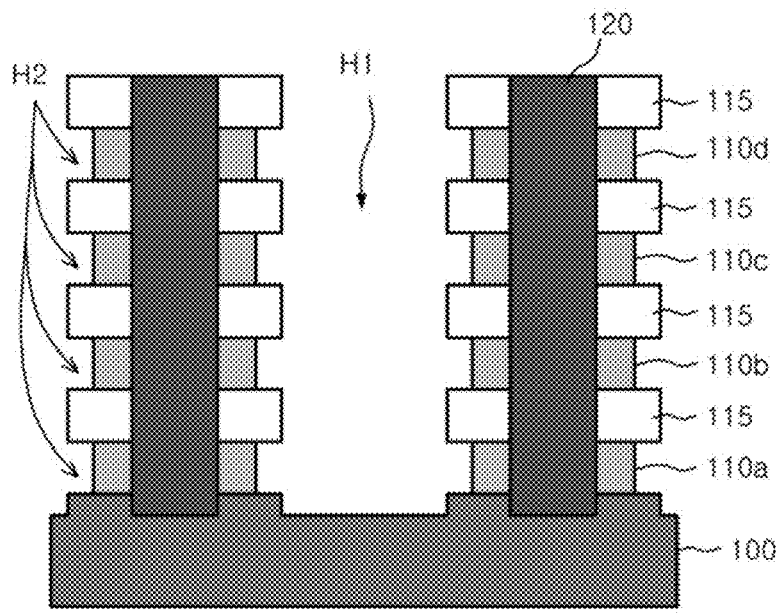
Figure 6B:
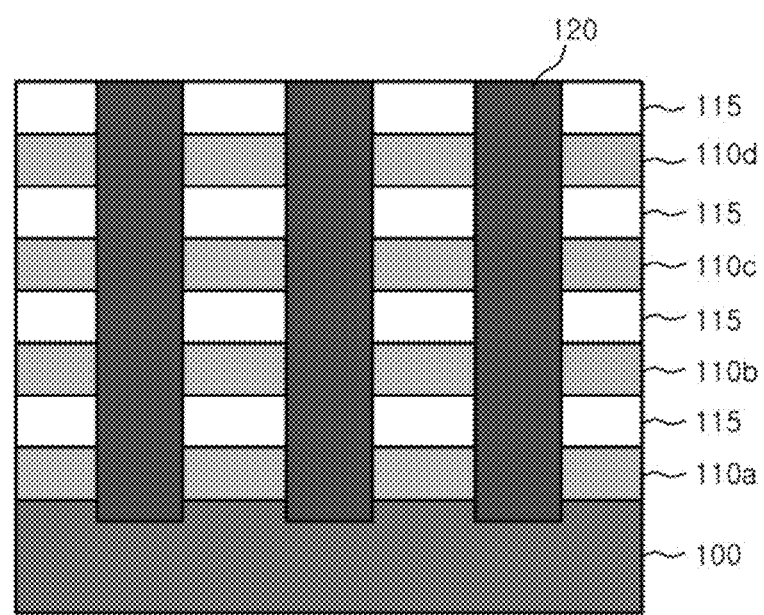

Referring to FIGS. 6A and 6B, to define a unit memory cell area, predetermined portions of the plurality of bit line layers 110a, 110b, 110c, and 110d (hereinafter, referred to as a plurality of bit lines) and the insulating layers 115 are patterned to form a first hole H1. The first hole H1 may be disposed at both sides of the gate electrode 120 when viewed in a direction parallel to the word line (see FIG. 6A). Next, the plurality of bit lines 110a, 110b, 110c, and 110d, exposed through the first hole H1, are recessed by a predetermined thickness to form second holes H2. The recess process may be performed using a known etching process.

Figure 7A:
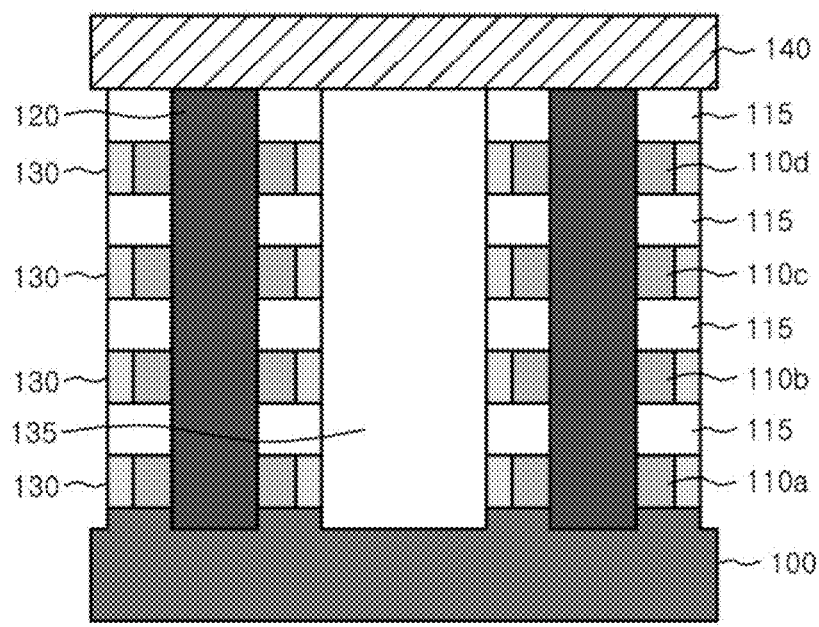
Figure 7B:
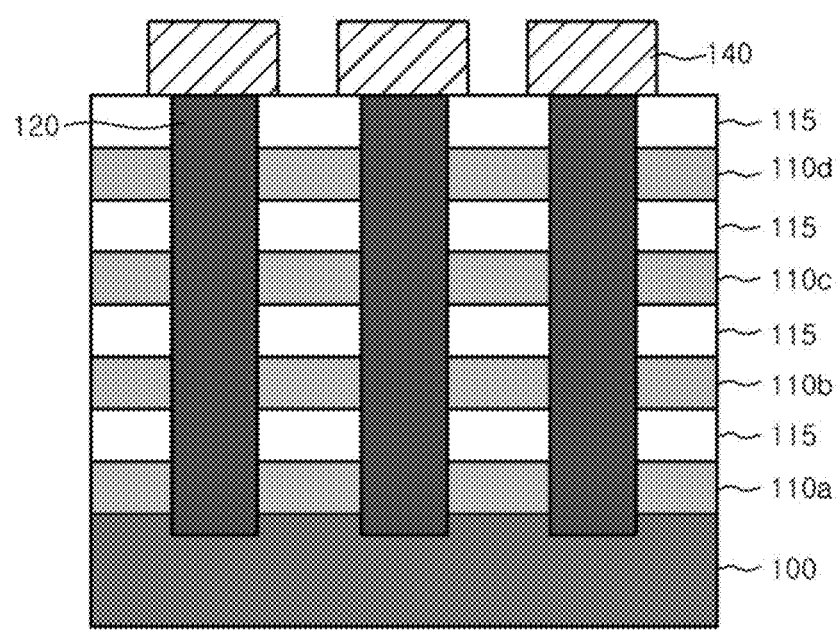

Referring to FIGS. 7A and 7B, variable resistance layers 130 are selectively buried in the second holes H2. The variable resistance layers 130 may be formed of, for example, a PCMO ($Pr_{1-x}Ca_xMnO_3$) layer as a material for a ReRAM, a chalcogenide layer as a material for a PCRAM, a magnetic layer as a material for a MRAM, a magnetization reversal device layer as a material for a spin-transfer torque magnetoresistive RAM (STTMRAM), or a polymer layer as a material for a polymer RAM (PoRAM) may be used. Next, an interlayer insulating layer 135 is formed in the first hole H1 to obtain cell separation into unit cell units. Next, a word line 140 is formed to be electrically connected to the gate electrode 120.

In the exemplary implementation, after the gate electrode 120 having a pillar structure is formed, the bit lines 110a, 110b, 110c, and 110d are formed to surround to the gate electrode 120. At this time, the depletion layers 125 may be formed between the gate electrode 120 and the bit lines 110a, 110b, 110c, and 110d. The depletion layers 125 are pinched off by an application of a sufficient reverse bias voltage to the gate electrode 120. Therefore, the path P of the write current I or the read current is bypassed to the variable resistance layer 130 and the memory operation is performed.

Figure 8:
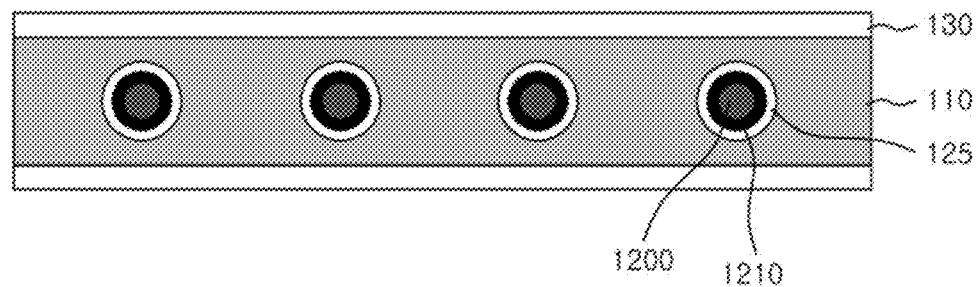
FIGS. 8 and 9 are views illustrating an exemplary variable resistance memory device.
Figure 9:
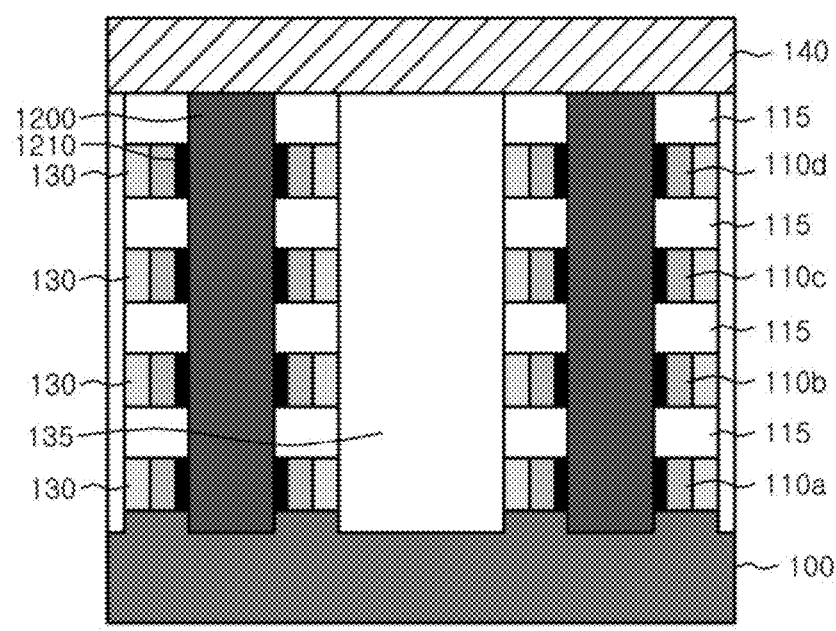

As illustrated in FIGS. 8 and 9, a gate electrode 1200 may be formed of a metal pillar and a silicide layer 1210 may be formed in a junction interface between the metal gate electrode 1200 and each of bit lines 110a, 110b, 110c, and 110d to cause a depletion layer between the silicide layer 1210 and each of the bit lines 110a, 110b, 110c, and 110d.

Figure 5B:
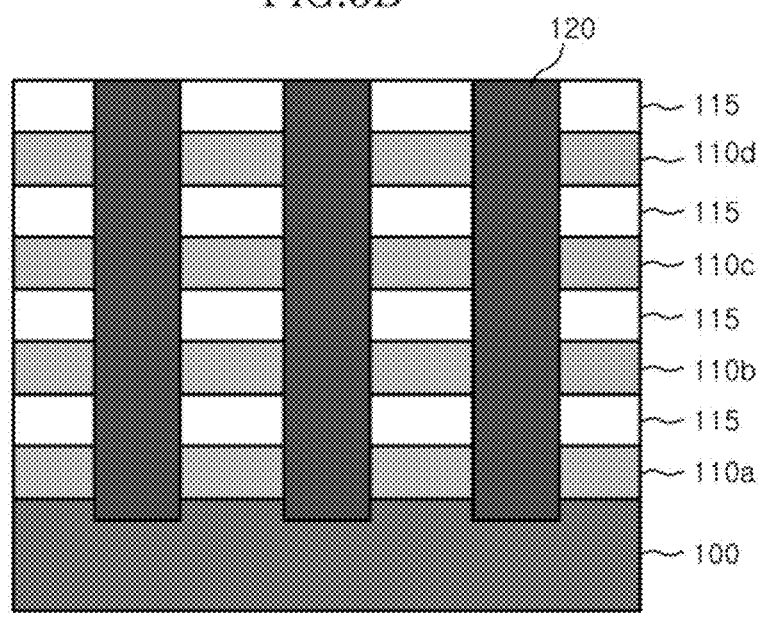

The above-described structure may be obtained by a refractory metal layer in the through hole in the process of FIGS. 5A and 5B instead of the P-type polysilicon layer and forming the silicide layer 1210 having a predetermined thickness by reacting (e.g., heat treatment) the gate electrode 1200 formed of the refractory metal layer and an N-type polysilicon layer as a material for the bit lines 110a, 110b, 110c, and 110d.

Figure 10:
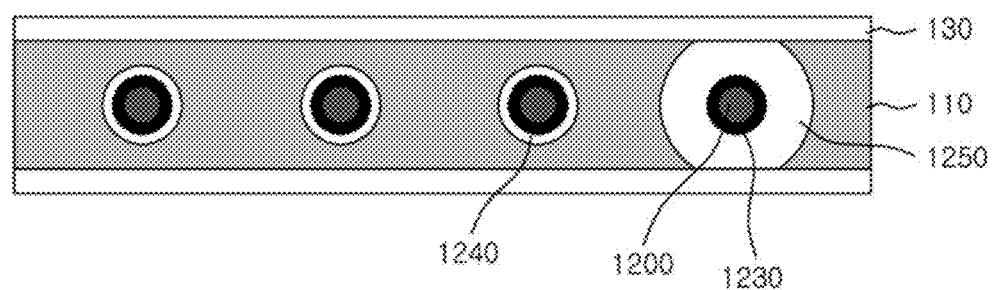
FIGS. 10 and 11 are views illustrating an exemplary variable resistance memory device.
Figure 11:
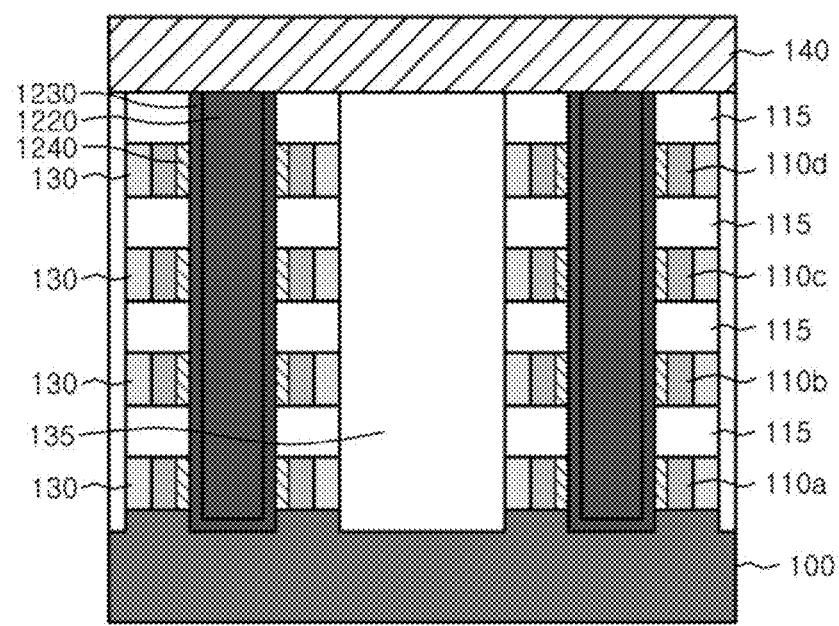

Further, in an exemplary implementation, as illustrated in FIGS. 10 and 11, a gate electrode 1200 may be formed of a conductive material, for example, a metal pillar. A P-type impurity layer 1240 may be interposed between the gate electrode 1200 and each of bit lines 110a, 110b, 110c, and 110d, which include an N-type polysilicon layer. Here, the P-type impurity layer 1240 may be an impurity layer formed in each of the bit lines 110a, 110b, 110c, and 110d.

The above-described structure induces a channel region 1250 which comes in contact with a variable resistance layer 130 by expanding the P-type impurity layer 1240 through application of a bias voltage that is larger than a threshold voltage to the gate electrode 1200.

The channel region 1250 functions to bypass a current path flowing through the bit line 110 to the variable resistance layer 130 by blocking the current path.

Therefore, a memory operation of the variable resistance layer 130 may be realized.

A gate insulating layer 1230 may be interposed between the gate electrode 1200 and the P-type impurity layer 1240. The P-type impurity layer 1240 may be formed, for example, by a tilted ion implantation process into the bit lines 110a, 110b, 110c, and 110d, exposed through a sidewall of the through hole, before the forming of the gate electrode 1200.

As described above, the memory operation may also be realized by bypassing the current path through expansion of the channel region.

The above exemplary implementations are is illustrative and not limitative. Various alternatives and equivalents are possible. The invention is not limited by the exemplary implementations described herein. Nor is the invention limited to any specific type of semiconductor device. Other additions, subtractions, or modifications are obvious in view of the present disclosure and are intended to fall within the scope of the appended claims.

What is claimed is:

1. A variable resistance memory device, comprising:
   a base layer;
   a plurality of pillar-shaped gate electrodes formed on the base layer and extending substantially perpendicular to a surface of the base layer;
   a current transfer layer formed to surround the plurality of pillar-shaped gate electrodes;
   a variable resistance layer formed in an outer portion of the current transfer layer; and
   a plurality of blocking layers generated between each of the plurality of pillar-shaped gate electrodes and the current transfer layer,
   wherein the plurality of pillar-shaped gate electrodes are formed of a conductive material and the current transfer layer is formed of a predetermined conductivity-type semiconductor layer, and
   further comprising:
   a junction layer interposed between each of the plurality of pillar-shaped gate electrodes and the current transfer layer; and
   a gate insulating layer interposed between each of the plurality of pillar-shaped gate electrodes and the junction layer.

2. The variable resistance memory device of claim 1, wherein the junction layer is formed to have an opposite conductivity type to a conductivity type of the current transfer layer, and
   the junction layer forms a channel that serve as the blocking layer based on the voltage applied to the selected pillar-shaped gate electrode.

3. The variable resistance memory device of claim 1, wherein the base layer includes an insulating material.

4. A variable resistance memory device, comprising:
   a base layer;
   a plurality of pillar-shaped gate electrodes formed on the base layer and extending substantially perpendicular to a surface of the base layer;
   a plurality of bit lines alternately stacked with a plurality of insulating layers surround the plurality of pillar-shaped gate electrodes;
   a plurality of variable resistance layers formed in outer portions of the plurality of bit lines; and
   a plurality of blocking layers generated between each of the plurality of pillar shaped gate electrode and the plurality of bit lines,
   wherein the plurality of pillar-shaped gate electrodes are formed of a conductive material and the plurality of bit lines are formed of a predetermined conductivity-type semiconductor layer, and
   further comprising:
   a plurality of junction layers interposed between each of the plurality of pillar-shaped gate electrodes and the plurality of bit lines; and
   a gate insulating layer interposed between each of the plurality of pillar-shaped gate electrodes and each of the junction layers.

5. The variable resistance memory device of claim 4, wherein the plurality of junction layers are formed to have an opposite conductivity type to a conductivity type of the plurality of bit lines, and
   the plurality of junction layers form channels that serve as the blocking layers based on the voltage applied to the selected pillar-shaped gate electrode.

6. The variable resistance memory device of claim 4, wherein the base layer include an insulating material.

* * * * *